(12) United States Patent
Madge et al.

(10) Patent No.: US 7,073,107 B2
(45) Date of Patent: Jul. 4, 2006

(54) ADAPTIVE DEFECT BASED TESTING

(75) Inventors: Robert Madge, Portland, OR (US); Vijayashanker Rajagopalan, Fairview, OR (US)

(73) Assignee: LSI Logic Corporation, Milpitas, CA (US)

( * ) Notice: Subject to any disclaimer, the term of this patent is extended or adjusted under 35 U.S.C. 154(b) by 468 days.

(21) Appl. No.: 10/377,426

(22) Filed: Feb. 28, 2003

(65) Prior Publication Data

US 2004/0181717 A1    Sep. 16, 2004

(51) Int. Cl.
*G01R 31/28* (2006.01)
(52) U.S. Cl. .......................... 714/724; 714/33
(58) Field of Classification Search ............. 714/25, 714/724, 799; 438/14, 17; 324/500; 702/117
See application file for complete search history.

(56) References Cited

U.S. PATENT DOCUMENTS 5,068,814 A * 11/1991 Stark et al. ................. 702/185
5,726,920 A * 3/1998 Chen et al. ................. 702/108

(Continued)

OTHER PUBLICATIONS

Van der Pol et al., "Impact of Screening of Latent Defects at Electrical Test on the Yield-Reliability Relation and Application to Burn-in Elimination", Mar. 31-Apr. 2, 1998, 1998 IEEE International Proceedings, pp. 370-377.*

(Continued)

*Primary Examiner*—Guy Lamarre
*Assistant Examiner*—John P. Trimmings
(74) *Attorney, Agent, or Firm*—Luedeka, Neely & Graham PC

(57) ABSTRACT

A method of testing integrated circuits. Each of the integrated circuits is tested with a first test at a first level of testing at a preceding testing step in a fabrication cycle of the integrated circuits to produce first test results associated with a first characteristic of the integrated circuits. The first test results are recorded with associated integrated circuit identification information. The integrated circuits are logically subdivided into bins based at least in part on the associated integrated circuit identification information. A defectivity value is calculated for each bin of subdivided integrated circuits based at least in part on the first test results recorded with the associated integrated circuit identification information. The integrated circuits within each of the bins are tested with a second test at a second level of testing at a succeeding testing step in the fabrication cycle of the integrated circuits to produce second test results associated with a second characteristic of the integrated circuits. The second characteristic is related to the first characteristic and the second level of testing is varied from bin to bin based at least in part on the defectivity value for the bin being tested.

16 Claims, 1 Drawing Sheet

U.S. PATENT DOCUMENTS

| | | | |
|---|---|---|---|
| 6,167,545 A * | 12/2000 | Statovici et al. | 714/724 |
| 6,175,812 B1 * | 1/2001 | Boyington et al. | 702/118 |
| 6,304,095 B1 * | 10/2001 | Miyamoto | 324/765 |
| 6,618,682 B1 * | 9/2003 | Bulaga et al. | 702/84 |
| 6,943,575 B1 * | 9/2005 | Marr | 324/765 |
| 6,966,019 B1 * | 11/2005 | Viens et al. | 714/724 |
| 2002/0121915 A1 * | 9/2002 | Alonso Montull et al. | 324/765 |
| 2003/0151422 A1 * | 8/2003 | Barnett et al. | 324/765 |

OTHER PUBLICATIONS

S. Brenner, "Optimal Production Test Times Through Adaptive Test Programming", Oct. 30-Nov. 1, 2001, ITC International Test Conference, pp. 908-915.*

Butler et al., "An Emperical Study on the Effects of Test Type Ordering on Overall Test Efficiency", Oct. 3-5, 2000, ITC International Test Conference, pp. 408-416.*

Daasch et al., "Neighbor Selection for Variance Reduction in IDDQ and Other Parametric Data", Oct. 30-Nov. 1, 2001, ITC International Test Conference, pp. 92-100.*

Miller et al., "Unit Level Predicted Yield: a Method of Identifying High Defect Density Die at Wafer Sort", Oct. 30-Nov. 1, 2001, ITC Proceedings, 2001, pp. 1118-1127.*

* cited by examiner

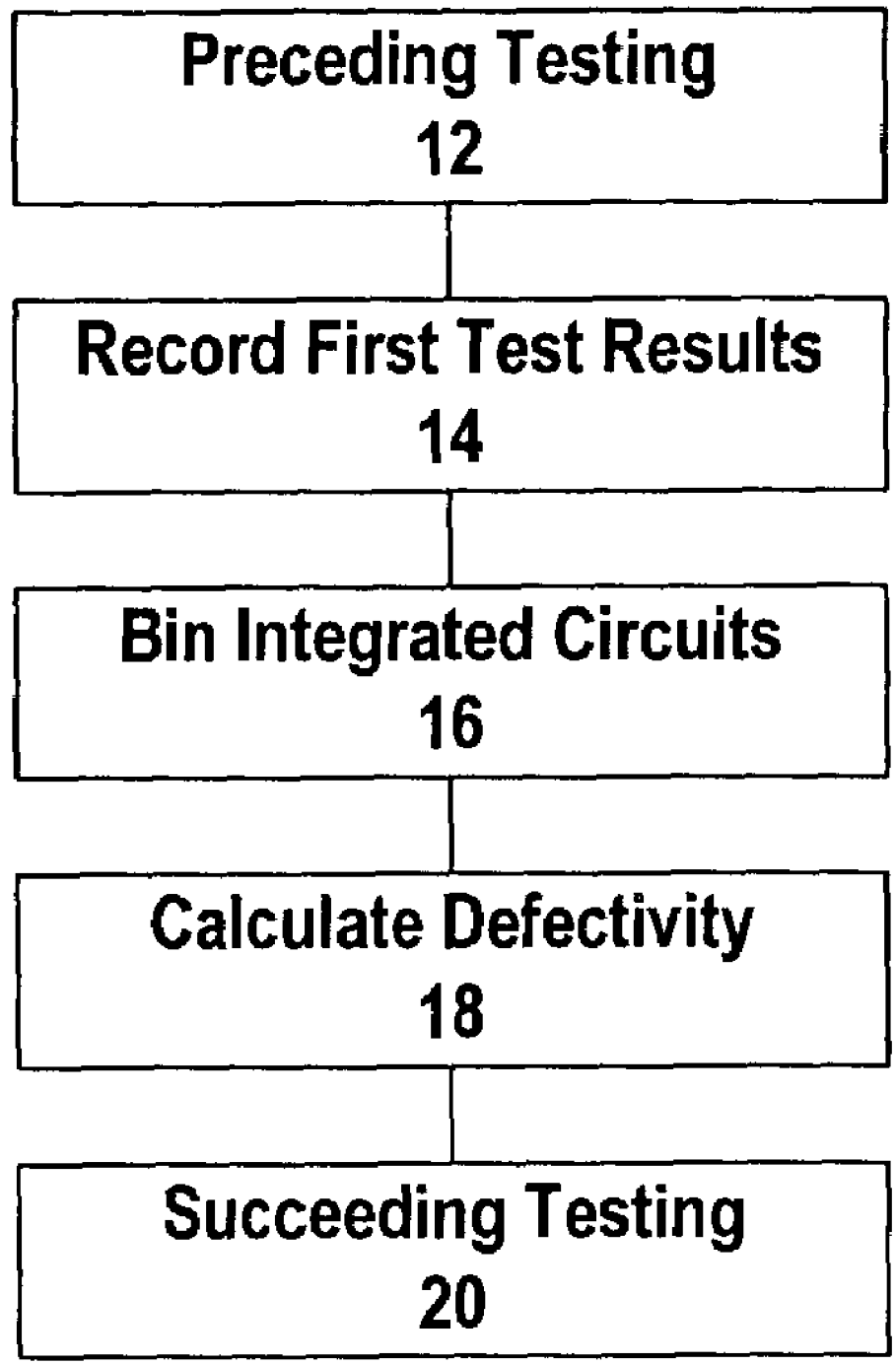

ADAPTIVE DEFECT BASED TESTING

FIELD

This invention relates to the field of integrated circuit fabrication. More particularly, this invention relates to electrically testing integrated circuits.

BACKGROUND

As the size of integrated circuits shrinks, the number of devices within an integrated circuit has risen. For example, a rule of thumb commonly called Moore's Law states that the number of transistors in a state of the art integrated circuit generally doubles every eighteen months. For many years this rule of thumb has generally been true. Thus, the increase in the number of cells within an integrated circuit has grown exponentially rather than linearly. Obviously, over the past several years the number of cells within a single integrated circuit has virtually exploded.

This tremendous and rapid increase in the number of active devices within an integrated circuit has come about as a result of innovation and changes in the way that the devices are designed and fabricated. Thus, many different issues have been overcome in accomplishing this increase in the capacity of integrated circuits. At the same time, however, this increase in the complexity and capacity of integrated circuits has created new challenges in regard to other aspects of integrated circuit fabrication, such as testing.

Integrated circuits typically receive a wide variety of testing throughout the fabrication process, both to ensure that the processes used to fabricate the integrated circuits are in control, and also to ensure that the structures formed by the various processes have the proper characteristics. Most of the tests performed during the fabrication process look at only an extremely narrow range of characteristics, which tend to be pertinent only to the step in the fabrication process that was most recently completed. This type of testing is generally referred to as inline testing herein. As alluded to above, inline testing is typically performed throughout the front end fabrication processes of the integrated circuits.

However, there are typically two different instances where a large battery of tests are performed on the integrated circuits, to ensure that the integrated circuit as a whole functions in the desired manner. The first of these comprehensive tests is performed at the end of front end processing, and is commonly called wafer sort. It is so called because the integrated circuits have been processed in wafer form up to this point in the fabrication process. The second of these tests is performed at the end of back end processing, and is commonly called final test. During back end processing the integrated circuits have been diced and packaged, and are then tested as completed devices.

Another type of test typically performed on integrated circuits is known as stress testing. Stress testing of integrated circuits is often used to either eliminate or at least decrease the level of burn in testing required. During stress testing, the voltage level applied to the integrated circuit is elevated past the specification limits for a given length of time to see whether such a voltage impairs the integrated circuit. This is typically known as enhanced voltage stress testing. Dynamic voltage stress testing can be performed either in addition to or in place of enhanced voltage stress testing. During dynamic voltage stress testing, the applied voltage is varied from a high value to a low value over a period of time, again to determine whether such a voltage shift impairs the integrated circuit. Although stress testing reduces the need for the expensive and time consuming burn in, it is itself a rather lengthy test, and therefore appreciably adds to the cost of an integrated circuit.

Because integrated circuits have so many more active devices than in times past, the time required for stress testing, and wafer sort and final test, jointly and severally referred to as comprehensive testing herein, has likewise increased exponentially. Because this required length of time adds an unacceptable labor and equipment expense to the fabrication costs of the integrated circuits, there is continual pressure to discover and implement alternate procedures for testing the integrated circuits, which procedures are preferably less time consuming but at least adequately thorough.

What is needed, therefore, is a test methodology by which an integrated circuit can be adequately tested within an amount of time that is less than that of prior art techniques.

SUMMARY

The above and other needs are met by a method of testing integrated circuits. Each of the integrated circuits is tested with a first test at a first level of testing at a preceding testing step in a fabrication cycle of the integrated circuits to produce first test results associated with a first characteristic of the integrated circuits. The first test results are recorded with associated integrated circuit identification information. The integrated circuits are logically subdivided into bins based at least in part on the associated integrated circuit identification information. A defectivity value is calculated for each bin of subdivided integrated circuits based at least in part on the first test results recorded with the associated integrated circuit identification information. The integrated circuits within each of the bins are tested with a second test at a second level of testing at a succeeding testing step in the fabrication cycle of the integrated circuits to produce second test results associated with a second characteristic of the integrated circuits. The second characteristic is related to the first characteristic and the second level of testing is varied from bin to bin based at least in part on the defectivity value for the bin being tested.

In this manner, the level of testing for the succeeding testing step can be adjusted as needed based on the defectivity of the preceding testing step. Thus, if there is a high level of defectivity, then a higher level of testing can be accomplished at the succeeding testing step to ensure that all of the integrated circuits slated for sale meet the acceptable minimum performance criteria. However, if there is a low level of defectivity detected at the preceding testing step, then a lower level of testing can be accomplished at the succeeding testing step, because higher testing levels are not required to ensure that the integrated circuits meet the acceptable minimum performance criteria. Thus the total amount of testing can be reduced, saving both time and money in the testing of the integrated circuits.

In various preferred embodiments, the preceding test is an inline test and the succeeding test is at least one of wafer sort and final test. Alternately, the preceding test is wafer sort and the succeeding test is final test. In one embodiment the succeeding testing step is stress testing. In one embodiment the first test and the second test are the same test that is performed at each of the preceding testing step and the succeeding testing step. Preferably the first test is at least one of functional test, Iddq, scan, transition delay fault, oxide break down voltage, Vddmin, Fmax, I/O leakage, and memory test.

In one embodiment the second level of testing is a normal level of testing, based on the defectivity being greater than a predetermined value. In a second embodiment the second level of testing is a reduced level of testing, based on the defectivity being less than a predetermined value, and in a third embodiment the second level of testing is no testing of the second test at all, based on the defectivity being less than a predetermined value.

In various embodiments the bins are based on integrated circuits having similar first test results, or alternately based on a substrate region identification as recorded in the associated integrated circuit identification information, or alternately based on a substrate identification as recorded in the associated integrated circuit identification information, or alternately based on a lot identification as recorded in the associated integrated circuit identification information.

In one embodiment there are additionally the steps of calculating a second running defectivity for the bin during the second test, and dynamically adjusting the second level of testing for the bin based at least in part on the second running defectivity. Preferably the preceding testing step comprises a plurality of first tests at a plurality of first levels and the succeeding testing step comprises a plurality of second tests at a plurality of second levels. Most preferably the preceding testing step comprises a plurality of first tests at a plurality of first levels and the succeeding testing step comprises a plurality of second tests at a plurality of second levels, and the binning of the integrated circuits is different for different second tests.

In one embodiment the preceding testing step is wafer sort and the first test comprises both leakage/bridging and frequency/VDD. The succeeding testing step is stress testing and the second test comprises both enhanced voltage stress testing and dynamic voltage stress testing. In this embodiment the first test results for an individual integrated circuit are statistically compared to the first test results for other integrated circuits within the same bin to determine the second levels of testing.

In one sub embodiment the leakage/bridging and the frequency/VDD first test results for the individual integrated circuit are statistically similar to the leakage/bridging and the frequency/VDD first test results for the other integrated circuits within the same bin, and the second levels of testing are reduced to no testing.

In an alternate sub embodiment the leakage/bridging first test results for the individual integrated circuit are statistically similar to the leakage/bridging first test results for the other integrated circuits within the same bin, and the frequency/VDD first test results for the individual integrated circuit are not statistically similar to the frequency/VDD first test results for the other integrated circuits within the same bin. In this embodiment the second level of testing for enhanced voltage stress testing is reduced to no testing and the second level of testing for dynamic voltage stress testing is a normal level of testing.

In a further alternate sub embodiment the leakage/bridging first test results for the individual integrated circuit are not statistically similar to the leakage/bridging first test results for the other integrated circuits within the same bin, and the frequency/VDD first test results for the individual integrated circuit are statistically similar to the frequency/VDD first test results for the other integrated circuits within the same bin. In this embodiment the second level of testing for enhanced voltage stress testing is a normal level of testing and the second level of testing for dynamic voltage stress testing is reduced to no testing.

BRIEF DESCRIPTION OF THE DRAWING

Further advantages of the invention are apparent by reference to the detailed description when considered in conjunction with the figure, which is a flow chart of a method according to the present invention.

DETAILED DESCRIPTION

With reference now to the figure, there is depicted a flow chart of the method 10 according to a general embodiment of the invention. An overview of the method is first presented, and then each of the steps is discussed in more detail thereafter, describing the various embodiments that are envisioned within each of the steps. It is understood that these various embodiments within the various steps can be combined in a great number of different combinations, and that each such unique combination is not explicitly described herein, even though all such come within the spirit of the invention.

The integrated circuits are tested in the preceding testing step as given in block 12, and the results of the first test are recorded as given in block 14. The integrated circuits are binned in some manner as given in block 16, and a defectivity for each of the bins is calculated as given in block 18. The succeeding testing is performed on the integrated circuits as given in block 20, where the level of testing used in the succeeding testing is based at least in part on the defectivity that was calculated for each of the various bins.

The preceding test 12 is either any one of the various inline tests or wafer sort testing, but is testing that is accomplished at a different point in the fabrication process than the succeeding test 20. By this it is meant that there are fabrication processes that are conducted between the preceding test 12 and the succeeding test 20, and the preceding test 12 and the succeeding test 20 are not just different portions of the same test, such as testing a first portion of the integrated circuits on a substrate and calling it the preceding test 12 and then testing a second portion of the integrated circuits and calling it the succeeding test 20. Rather, the integrated circuits are further processed between the preceding test 12 and the succeeding test 20, such as further front end processing between inline testing and wafer sort, or further back end processing between wafer sort and final test. Thus, the methods as described herein are not designed to reduce the amount of testing that is required during a current testing regimen, but rather are designed to reduce the amount of testing that is required during a future testing regimen, although there are embodiments that may additionally either reduce or increase the level of future testing that are applied during such future testing.

Preferably, a plurality of first tests are conducted during the preceding test 12. The first tests that are conducted during inline testing and wafer sort testing are well known in the field of integrated circuit fabrication, and do not require elaborate or extended description herein, because no fundamental change in the type of testing at the preceding test 12 is anticipated by the present invention. However, for the sake of example, the first tests preferably include such tests as functional test, Iddq, scan, transition delay fault, oxide break down voltage, Vddmin, Fmax, I/O leakage, and memory test.

Each of these first tests are preferably conducted at a first level of testing. That is to say that a given number of test vectors, are input into the integrated circuits in order to adequately characterize the integrated circuits to at least a minimum desired level of functionality. Alternately, instead of using a given number of test vectors, test vectors are applied until at least a minimum desired level of functionality is ensured by the first level of testing. Some tests do not use vectors, per se, but rather are a test of some other type, such as a visual inspection. Again, this first testing level is not described with too much specificity, because the first level of testing used by the method of the present invention is not a different level of testing from that as typically used in the integrated circuit fabrication industry to achieve traditionally desired results. As mentioned above, one object of the invention is to reduce the level of future testing at the succeeding testing step, not to reduce the level of testing at the preceding testing step.

After the first tests are completed at the preceding testing step 12, the results of the first tests are recorded as given in block 14 of the figure. Preferably, the results of each test are recorded for each integrated circuit that has been tested. Identification information for each integrated circuit is also preferably recorded in association with the first test results. By this it is meant that the recorded data 14 can be retrieved based on the identification information for any given integrated circuit, and conversely, the identification information for any given integrated circuit can be retrieved based on its associated first test results. The associated integrated circuit identification information preferably includes information such as the lot identification, wafer identification, and position on the wafer identification for each and every integrated circuit.

As mentioned above, the integrated circuits are further processed between the preceding testing 12 and the succeeding testing 20. However, the other steps 14, 16, and 18 can occur either before, during, or after such further processing of the integrated circuits. Therefore, any indication herein of a specific order of such further processing in relation to the steps 14, 16, and 18 is by way of example only, and not by way of limitation.

After the first test results are recorded as given in block 14 of the figures, and prior to the succeeding testing step 20, the integrated circuits are binned in some manner, as given in block 16 of the figure. By binning it is meant that the integrated circuits are logically subdivided into different groups according to some criteria as described below. Thus, it should not be understood that the integrated circuits are necessarily physically singulated and placed in separate locations one from another as a part of the binning process, although such singulation and physical grouping may be a part of the binning in certain embodiments of the method of the invention, such as when the preceding test step 12 is wafer sort.

The binning may be according to any one or more of various criteria or their combination, such as physical or logical criteria. For example, physical criteria may include those such as lot, wafer, or region of the wafer in which the integrated circuit is located. Regions may include wafer divisions such as quadrants, edge devices, annular portions, or bands. Logical criteria may include devices such as those that are processed at a certain step within a given time period, such as all those wafers that received a source/drain ion implantation process in reactor number two on the second shift last Tuesday. Thus, binning as used herein is not limited to the traditional concept of failure mode binning.

Once the integrated circuits have been binned, and before they are tested at the succeeding testing step, the defectivity of each bin is calculated as given in block 18 of the figure. The defectivity is typically calculated not only for each bin, but for each of the first tests performed at the preceding test step, within each bin. Defectivity is preferably calculated as a percentage of devices within the bin that fail the given first test, or alternately the number of devices failing the given first test per unit area within the bin, or even the raw number of device within the bin that fail the given first test.

Once the steps 12, 14, 16, and 18 above have been performed, and the integrated circuits have received further processing from the preceding test step 12, then the succeeding testing step can be performed as given in block 20 of the figure. Although the recording step 14 of the method 10 is preferably done somewhat concurrently with the preceding testing 12, the other two steps 16 and 18 could be done somewhat in conjunction with the succeeding testing 20, where the steps 16 and 18 relevant to a portion of the succeeding testing 20 are performed just immediately prior to such testing. Alternately, the preceding testing 12 and the succeeding testing 20 are performed on dedicated testers and the steps 16 and 18 are performed on off line analyzers.

The succeeding testing 20 is preferably one of either wafer sort or final testing, including stress testing. It is not within the scope of the invention that inline testing be a part of the succeeding testing 20, because there is no other earlier testing that could then be used as the preceding testing, and on which the testing level as described below could be based. However, if the inline testing is the preceding testing, then either the wafer sort or the final test could be the succeeding testing, and if the wafer sort is the preceding testing, then the final test could be the succeeding testing. In one very specific embodiment, it is possible for one or more of inline testing, wafer sort, and final test to be the preceding testing and stress testing to be the succeeding testing, as described in more detail elsewhere herein.

A plurality of second tests are preferably performed at the succeeding testing 20. The second tests are preferably each performed at a second level that may vary from bin to bin and test to test, depending upon the defectivity of first tests that are related to the second tests within each of the bins. Thus, a given defectivity on a given first test within a given bin will dictate that a related second test should be performed at a specific second level of testing within that bin, but other second test will be performed at other levels because the first test to which they are related have different defectivities. Thus, the second level of testing varies from bin to bin and from second test to second test. By "related test" it is meant those tests that are indicative of a similar characteristic of the integrated circuit, even though the tests may detect different attributes of the same integrated circuit characteristic.

In general, it is preferred that those bins and first tests which exhibit a higher defectivity at the preceding testing 12 will dictate that those related second tests will be performed at a higher level of testing at the succeeding testing 20, and those bins and first tests which exhibit a lower defectivity at the preceding testing 12 will dictate that those related second tests will be performed at a lower level of testing at the succeeding testing 20. Some second tests may be reduced to a second level of no testing whatsoever, depending upon factors such as what tests they are, what bins they are within, what first tests they are related to, and how low the defectivity of those first tests are. Such levels and indications are preferably set on a process by process basis, using empirically derived data.

For example, if a statistically normal level of defectivity is observed for a given first test and bin combination, then the related second tests are preferably performed at a standard or normal second level of testing, without any modification. However, if a statistically reduced level of defectivity is observed for a first test and bin combination, the related second test are preferably performed at a second level of testing that is reduced from the standard or normal level of testing, as there is a reduced chance that bad devices would be shipped as a result of the reduced second level of testing. Similarly, if a statistically elevated level of defectivity is observed for a first test and bin combination, the related second test are preferably performed at a second level of testing that is increased from the standard or normal level of testing, as there is an increased chance that bad devices would be shipped without such increased testing.

It is appreciated that not every second test is related to every first test. Obviously those tests that are identical and that are performed at both the preceding testing and the succeeding testing are related tests. Other related tests include, by way of example and not limitation, Frequency/VDD and dynamic voltage stress testing; and Leakage/bridging and enhanced voltage stress testing.

Further, first tests performed at the preceding testing step 12 can be categorized as to what type of defect they detect, or in other words, what device characteristic they detect. Second tests performed at the succeeding testing step 20 are also designed to detect certain types of defects or characteristics, as known in the art. Those first tests with low defectivity indicate that fewer related second tests need to be performed to ensure compliance with the specification.

The reason for this is that there are preferably a certain few input test vectors that provide a great amount of information in regard to the acceptability of an integrated circuit in regard to a given characteristic or set of characteristics. If confidence is already relatively high that the device is good, then running many additional vectors to confirm the last few percentage points of acceptance on a given device is a study in dramatically diminishing returns. In other words, a few vectors can determine that a large percentage of the functionality of an integrated circuit is good, but it takes many, many more vectors to ensure that it is one hundred percent good as to that failure type.

For a device that has a reasonably low defectivity rate, as calculated from the preceding test, and where the value of "reasonably low" is empirically determined for a given process, test, and device, there is no need to spend the time in running all of the additional vectors to confirm that which can be reasonably and statistically inferred from the preceding test defectivity. Thus, depending on the defectivity as determined at the preceding testing, the succeeding testing may need to run only a few, or even no test vectors for a given defect type. Further, if a reduced set of vectors is warranted, either more comprehensive or less comprehensive vectors can be selected, based at least in part upon the associated defectivity level from the preceding testing.

However, in one embodiment, if the failure rate for integrated circuits at the succeeding testing step is greater than anticipated, as based on the results of the first tests at the preceding testing step, then the second level of testing can be adjusted upward toward a standard, or if warranted, even an enhanced second level of testing. This provision acknowledges the possibility that something may have occurred in the intermediate processing steps that negatively impacted the yield of the devices.

For example, a software algorithm, running either on the tester or off the tester, preferably collects the fallout for various tests such as functional, scan, Iddq, transition delay fault, and memory, and calculates the defectivity of each defect type, such as stuck@, bridging, leakage, delay. The succeeding testing program preferably contains various test vector options such as high fault coverage, medium and low or high bridging fault coverage, high transition fault coverage, high opens faults coverage, and so forth. The succeeding testing program also preferably determines which vectors to use based on the calculated defectivity. For example, if stuck@ or bridging fallout is high, then more vectors or more rigorous vectors for detection of this defect type are used. If transition delay fallout or path delay fallout is low, then the vectors for detecting transition or path delay fault can either be reduced in number or coverage level. As the anticipated fallout changes during the succeeding testing, the testing can automatically switch back to a more appropriate targeted vector type or size, whether that be more rigorous or less rigorous.

Thus, in this embodiment the succeeding testing preferably keeps track of a second defectivity or fallout rate, and dynamically adjusts the level of testing, either increasing or decreasing the level, if the second defectivity is not as anticipated by the first defectivity that was calculated from the results of the preceding testing.

In addition to applying additional vectors, the second level of testing can also be adjusted by applying the same vectors either once or repeatedly, or for longer or shorter periods of time. The second level of testing can also be varied by applying stress tests for a longer or shorter period of time. The second level of testing may additionally be varied by the selection of which test vectors will be used, as some test vectors provide a higher fault coverage than other vectors. Thus, there are numerous ways in which the second level of testing can be adjusted, based on the defectivity from the first testing at the preceding testing step.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method of testing integrated circuits, the method comprising the steps of:

performing on each of the integrated circuits a first test at a first level of testing at a preceding testing step in a fabrication cycle of the integrated circuits to produce first test results associated with a first characteristic of the integrated circuits, recording the first test results with associated integrated circuit identification information, logically subdividing the integrated circuits into bins based at least in part on the associated integrated circuit identification information and not on the first test results, calculating a defectivity value for each bin of subdivided integrated circuits based at least in part on the first test results recorded with the associated integrated circuit identification information, performing on the integrated circuits within each of the bins a second test at a second level of testing at a succeeding testing step in the fabrication cycle of the integrated circuits to produce second test results associated with a second characteristic of the integrated circuits, where the second characteristic is related to the first characteristic and the second level of testing is varied from bin to bin based at least in part on the defectivity value for the bin being tested, where
    the second level of testing is a normal level of testing, based on the defectivity being substantially equal to a predetermined value,
    the second level of testing is a reduced level of testing, based on the defectivity being less than the predetermined value, and
    the second level of testing is an elevated level of testing, based on the defectivity being more than the predetermined value,
calculating a second running defectivity for the bin during the second test, and
dynamically adjusting the second level of testing for the bin based at least in part on the second running defectivity.

2. The method of claim 1, wherein the preceding test is an inline test and the succeeding test is at least one of wafer sort and final test.

3. The method of claim 1, wherein the preceding test is wafer sort and the succeeding test is final test.

4. The method of claim 1, wherein the first test and the second test are the same test.

5. The method of claim 1, wherein the first test is at least one of functional test, Iddq, scan, transition delay fault, oxide break down voltage, Vddmin, Fmax, I/O leakage, and memory test.

6. The method of claim 1, wherein the succeeding testing step is stress testing.

7. The method of claim 1, wherein the second level of testing is no testing of the second test at all, based on the defectivity being less than the predetermined value.

8. The method of claim 1, wherein the bins are based on a substrate region identification as recorded in the associated integrated circuit identification information.

9. The method of claim 1, wherein the bins are based on a substrate identification as recorded in the associated integrated circuit identification information.

10. The method of claim 1, wherein the bins are based on a lot identification as recorded in the associated integrated circuit identification information.

11. The method of claim 1, wherein the preceding testing step comprises a plurality of first tests at a plurality of first levels and the succeeding testing step comprises a plurality of second tests at a plurality of second levels.

12. The method of claim 1, wherein the preceding testing step comprises a plurality of first tests at a plurality of first levels and the succeeding testing step comprises a plurality of second tests at a plurality of second levels and the binning of the integrated circuits is different for different second tests.

13. The method of claim 1, wherein the preceding testing step is wafer sort and the first test comprises both leakage/bridging and frequency/VDD, and the succeeding testing step is stress testing and the second test comprises both enhanced voltage stress testing and dynamic voltage stress testing, and the first test results for an individual integrated circuit are statistically compared to the first test results for other integrated circuits within the same bin to determine the second levels of testing.

14. The method of claim 13, wherein the leakage/bridging and the frequency/VDD first test results for the individual integrated circuit are statistically similar to the leakage/bridging and the frequency/VDD first test results for the other integrated circuits within the same bin, and the second levels of testing are reduced to no testing.

15. The method of claim 13, wherein the leakage/bridging first test results for the individual integrated circuit are statistically similar to the leakage/bridging first test results for the other integrated circuits within the same bin, and the frequency/VDD first test results for the individual integrated circuit are not statistically similar to the frequency/VDD first test results for the other integrated circuits within the same bin, and the second level of testing for enhanced voltage stress testing is reduced to no testing and the second level of testing for dynamic voltage stress testing is a normal level of testing.

16. The method of claim 13, wherein the leakage/bridging first test results for the individual integrated circuit are not statistically similar to the leakage/bridging first test results for the other integrated circuits within the same bin, and the frequency/VDD first test results for the individual integrated circuit are statistically similar to the frequency/VDD first test results for the other integrated circuits within the same bin, and the second level of testing for enhanced voltage stress testing is a normal level of testing and the second level of testing for dynamic voltage stress testing is reduced to no testing.

* * * * *